United States Patent
Chou et al.

(10) Patent No.: US 10,312,569 B1
(45) Date of Patent: Jun. 4, 2019

(54) SURFACE-MOUNTED SIGNAL TRANSCEIVER MODULE WITH MULTI-SIGNAL FEED-IN

(71) Applicant: Cirocomm Technology Corp., Tainan (TW)

(72) Inventors: Shin-Hui Chou, Tainan (TW); Chia-Tsung Wu, Tainan (TW); Chien-Hua Tseng, Tainan (TW)

(73) Assignee: CIROCOMM TECHNOLOGY CORP., Tainan (TW)

( * ) Notice: Subject to any disclaimer, the term of this patent is extended or adjusted under 35 U.S.C. 154(b) by 0 days.

(21) Appl. No.: 15/863,857

(22) Filed: Jan. 5, 2018

(51) Int. Cl.
  *H04B 1/40* (2015.01)
  *H01Q 1/22* (2006.01)
  (Continued)

(52) U.S. Cl.
  CPC ............... *H01Q 1/22* (2013.01); *H01Q 1/38* (2013.01); *H04B 1/44* (2013.01); *H04B 10/40* (2013.01); *H05K 1/181* (2013.01)

(58) Field of Classification Search
  CPC .......... H01Q 1/22; H01Q 1/2283; H01Q 1/24; H01Q 9/04; H01Q 9/0407; H01Q 9/0428; H04B 1/16; H04B 1/44; H04B 1/40
  See application file for complete search history.

(56) References Cited

U.S. PATENT DOCUMENTS

| 8,878,727 B2 * | 11/2014 | Goldberger ......... H01Q 9/0407 |
| | | 343/700 MS |
| 2006/0044191 A1 | 3/2006 | Harihara |

(Continued)

FOREIGN PATENT DOCUMENTS

| CN | 101651254 B | 1/2013 | |
| TW | M558478 U | 4/2018 | |
| WO | WO 2007/136182 | * 11/2007 | ............... H01Q 1/38 |

OTHER PUBLICATIONS

Office Action dated Dec. 11, 2018 of the corresponding Taiwan patent application.
(Continued)

*Primary Examiner* — Blane J Jackson
(74) *Attorney, Agent, or Firm* — Chun-Ming Shih; HDLS IPR SERVICES

(57) ABSTRACT

A surface-mounted signal transceiver module with multi-signal feed-in includes an antenna unit, a circuit board and a signal-integrating component. A radiation layer is arranged on a substrate-front face of the antenna unit. A ground layer is arranged on a substrate-back face. A first-feed-in line and a second-feed-in line are arranged on a substrate-side face. A first-ground face arranged on a circuit-board-front face of the circuit board is connected to the ground layer. A first contact and a second contact of the circuit board are connected to the first-feed-in line and the second-feed-in line respectively, and electrically connected to a fixing-connecting area arranged on a circuit-board-back face. The signal-integrating component is electrically connected to the fixing-connecting area, and connected to the first-feed-in line and the second-feed-in line through the first contact and the second contact respectively, to integrate signals sent through the first-feed-in line and the second-feed-in line.

18 Claims, 10 Drawing Sheets

(51) Int. Cl.
  *H01Q 9/04*   (2006.01)
  *H01Q 1/38*   (2006.01)
  *H05K 1/18*   (2006.01)
  *H04B 10/40*  (2013.01)
  *H04B 1/44*   (2006.01)

(56) References Cited

U.S. PATENT DOCUMENTS

| | | |
|---|---|---|
| 2006/0049990 A1 | 3/2006 | Watada et al. |
| 2007/0013599 A1* | 1/2007 | Gaucher .................. H01Q 9/26 343/795 |
| 2007/0159397 A1* | 7/2007 | Rooyen ................ H01Q 9/0435 343/700 MS |
| 2009/0153428 A1 | 6/2009 | Rofougaran et al. |
| 2017/0317402 A1* | 11/2017 | Hwang .................... H01Q 1/24 |

OTHER PUBLICATIONS

Office Action dated Jan. 18, 2019 of the corresponding German patent application.

* cited by examiner

SURFACE-MOUNTED SIGNAL TRANSCEIVER MODULE WITH MULTI-SIGNAL FEED-IN

BACKGROUND OF THE INVENTION

Field of the Invention

The present invention relates to an antenna structure, and especially relates to a surface-mounted signal transceiver module with multi-signal feed-in to increase the bandwidth.

Description of the Related Art

It is known that the current pin type planar antenna approximately comprises a substrate made of ceramic materials. A radiation metal sheet is arranged on the surface of the substrate. A ground metal sheet is arranged on the bottom side of the substrate. A perforation is defined through the substrate, the radiation metal sheet and the ground metal sheet. The perforation is provided for a T-shaped signal feed-in object to be through the perforation, so a planar antenna structure which can be assembled with the motherboard is formed. Another surface-mounted patch antenna, which is currently provided on the street stalls, similarly comprises a substrate made of ceramic materials. A radiation metal sheet is arranged on the surface of the substrate. A ground metal sheet is arranged on the bottom side of the substrate. A feed-in line is arranged on the side edge of the substrate. One side of the feed-in line extends to the surface to form the coupled connection with the radiation metal sheet. The other side of the feed-in line extends to the bottom side, but is not electrically connected to the ground metal sheet.

Each of the two planar antennas mentioned above has only one signal feed-in rendering that the receiving bandwidth of the planar antenna is narrower, so the bandwidth for receiving signals is limited.

SUMMARY OF THE INVENTION

Therefore, a main object of the present invention is to solve the conventional deficiency. In the present invention, the design of two signal feed-in is arranged to a single antenna unit made of dielectric constant materials, in order to form a circularly polarized antenna with multi-signal feed-in to increase the antenna bandwidth.

In order to achieve the object mentioned above, the present invention provides a surface-mounted signal transceiver module with multi-signal feed-in comprising an antenna unit, a circuit board and a signal-integrating component. The antenna unit comprises a substrate, a radiation layer, a ground layer, a first-feed-in line and a second-feed-in line. The substrate comprises a substrate-front face, a substrate-back face and a substrate-side face. The radiation layer is arranged on the substrate-front face of the substrate. The ground layer is arranged on the substrate-back face of the substrate. Moreover, the first-feed-in line and the second-feed-in line are arranged on the substrate-side face of the substrate. One side of the first feed-in line and one side of the second feed-in line extend to the substrate-front face of the substrate respectively to form coupled electrical connections with the radiation layer (namely, one side of the first feed-in line and one side of the second feed-in line extend to the substrate-front face of the substrate respectively and are electrically connected to the radiation layer). The other side of the first feed-in line and the other side of the second feed-in line extend to the substrate-back face of the substrate respectively. Neither the other side of the first feed-in line nor the other side of the second feed-in line is electrically connected to the ground layer. The circuit board comprises a circuit-board-front face, a circuit-board-back face, a first-ground face, a first contact, a second contact and a fixing-connecting area. The first-ground face, the first contact and the second contact are arranged on the circuit-board-front face. The first-ground face is electrically connected to the ground layer. The first contact and the second contact are electrically connected to the first-feed-in line and the second-feed-in line respectively. Moreover, the first contact and the second contact are electrically connected to the fixing-connecting area arranged on the circuit-board-back face through the circuit board respectively. The signal-integrating component is electrically connected to and arranged on the fixing-connecting area, so the signal-integrating component is electrically connected to the first-feed-in line and the second-feed-in line through the first contact and the second contact respectively. Moreover, the first-feed-in line and the second-feed-in line are arranged on the substrate-front face, the substrate-side face and the substrate-back face of the substrate with a mutually perpendicular status. Namely, the first-feed-in line and the second-feed-in line are perpendicular to each other in virtual extension lines and are arranged on the substrate-front face, the substrate-side face and the substrate-back face of the substrate. The signal-integrating component is configured to integrate a plurality of signals sent through the first-feed-in line and the second-feed-in line.

In an embodiment of the present invention, an area of the radiation layer is less than an area of a substrate surface of the substrate.

In an embodiment of the present invention, an area of the ground layer is equal to an area of the substrate-back face.

In an embodiment of the present invention, the first-ground face is cross-shaped.

In an embodiment of the present invention, the circuit board further comprises four second-ground faces. Four sides of the first-ground face are adjacent to the four second-ground faces. The second-ground face is electrically connected to the ground layer.

In an embodiment of the present invention, the first contact and the second contact are arranged between two of the second-ground faces respectively.

In an embodiment of the present invention, the first contact and the second contact are arranged on the circuit-board-front face of the circuit board with the mutually perpendicular status. Namely, the first contact and the second contact are perpendicular to each other on the virtual extension lines and are arranged on the circuit-board-front face of the circuit board.

In an embodiment of the present invention, the surface-mounted signal transceiver module further comprises a cable connector, or the surface-mounted signal transceiver module is applied to the cable connector. The signal-integrating component is electrically connected to the cable connector through the circuit board.

In an embodiment of the present invention, the substrate is made of ceramic materials.

In order to achieve the object mentioned above, the present invention further provides a surface-mounted signal transceiver module with multi-signal feed-in comprising an antenna unit, a metal shell, a circuit board and two conducting components. The antenna unit comprises a substrate, a radiation layer, a ground layer, a first-feed-in line and a second-feed-in line. The substrate comprises a substrate-front face, a substrate-back face and a substrate-side face. The radiation layer is arranged on the substrate-front face of the substrate. The ground layer is arranged on the substrate-back face of the substrate. The first-feed-in line and the second-feed-in line are arranged on the substrate-side face of the substrate. One side of the first feed-in line and one side of the second feed-in line extend to the substrate-front face of the substrate respectively to form coupled electrical connections with the radiation layer (namely, one side of the first feed-in line and one side of the second feed-in line extend to the substrate-front face of the substrate respectively and are electrically connected to the radiation layer). The other side of the first feed-in line and the other side of the second feed-in line extend to the substrate-back face of the substrate respectively. Neither the other side of the first feed-in line nor the other side of the second feed-in line is electrically connected to the ground layer. The metal shell comprises a platform, a plurality of support chips and a plurality of joint parts. The platform comprises a platform surface and a platform-side edge. The platform surface of the platform is electrically connected to the ground layer. The platform-side edge of the platform extends to the support chips, wherein the platform and the support chips have a mutually perpendicular status. Namely, the platform surface of the platform is perpendicularly connected to the support chips. Each of the support chips extends to the joint part. Moreover, two openings are defined by the platform. The circuit board comprises a circuit-board-front face, a circuit-board-side edge, a circuit-board-back face, two signal feed-in points, a plurality of ground parts and at least one conducting part. The two signal feed-in points are arranged on the circuit-board-front face of the circuit board. A plurality of notches are defined by the circuit-board-side edge of the circuit board. Each of the ground parts is arranged on the circuit-board-back face of the circuit board and is arranged in accordance with each of the notches. The joint parts are electrically connected to the ground parts through the notches. The at least one conducting part is arranged on the circuit-board-back face of the circuit board. The two conducting components are electrically contacted between the first-feed-in line, the second-feed-in line and the two signal feed-in points of the circuit board. Namely, one of the two conducting components is arranged to contact the first-feed-in line and one of the two signal feed-in points, and the other conducting component is arranged to contact the second-feed-in line and the other signal feed-in point. Moreover, the first-feed-in line and the second-feed-in line are arranged on the substrate-front face, the substrate-side face and the substrate-back face of the substrate with the mutually perpendicular status. Namely, the first-feed-in line and the second-feed-in line are perpendicular to each other in virtual extension lines and are arranged on the substrate-front face, the substrate-side face and the substrate-back face of the substrate. The first-feed-in line and the second-feed-in line are arranged on the metal shell in accordance with the two openings and are perpendicular to each other. Namely, the first-feed-in line and the second-feed-in line are perpendicular to each other on the virtual extension lines and are arranged on the metal shell in accordance with the two openings. Therefore, the two conducting components are electrically contacted or connected to the two signal feed-in points of the circuit board through the two openings.

In an embodiment of the present invention, an area of the radiation layer is less than an area of a substrate surface of the substrate.

In an embodiment of the present invention, an area of the ground layer is equal to an area of the substrate-back face.

In an embodiment of the present invention, the surface-mounted signal transceiver module further comprises an electronic part. The circuit-board-front face of the circuit board is electrically connected to the electronic part.

In an embodiment of the present invention, the electronic part comprises a filter and an amplifier. The filter is electrically connected to the amplifier.

In an embodiment of the present invention, the electronic part comprises a receiver module, the filter and the amplifier. The filter is electrically connected to the receiver module. The amplifier is electrically connected to the receiver module and the filter.

In an embodiment of the present invention, the joint part is bended or straight to be through the notch defined by the circuit-board-side edge of the circuit board to be electrically connected to the ground part.

In an embodiment of the present invention, the two conducting components are segments, columns, shrapnel or springs made of metal materials.

In an embodiment of the present invention, the conducting part renders that the circuit board is electrically connected to and arranged on a motherboard of an electronic apparatus.

In an embodiment of the present invention, the substrate is made of ceramic materials.

In order to achieve the object mentioned above, the present invention further provides a surface-mounted signal transceiver module with multi-signal feed-in surface-mounted on a circuit board. The surface-mounted signal transceiver module comprises an antenna unit. The antenna unit comprises a substrate, a radiation layer, a ground layer, a first-feed-in line and a second-feed-in line. The substrate comprises a substrate-front face, a substrate-back face and a substrate-side face. The radiation layer is arranged on the substrate-front face of the substrate. The ground layer is arranged on the substrate-back face of the substrate. Moreover, the first-feed-in line and the second-feed-in line are arranged on the substrate-side face of the substrate. One side of the first feed-in line and one side of the second feed-in line extend to the substrate-front face of the substrate respectively to form coupled electrical connections with the radiation layer (namely, one side of the first feed-in line and one side of the second feed-in line extend to the substrate-front face of the substrate respectively and are electrically connected to the radiation layer). The other side of the first feed-in line and the other side of the second feed-in line extend to the substrate-back face of the substrate respectively. Neither the other side of the first feed-in line nor the other side of the second feed-in line is electrically connected to the ground layer. Moreover, the first-feed-in line and the second-feed-in line are arranged on the substrate-front face, the substrate-side face and the substrate-back face of the substrate with a mutually perpendicular status. Namely, the first-feed-in line and the second-feed-in line are perpendicular to each other in virtual extension lines and are arranged on the substrate-front face, the substrate-side face and the substrate-back face of the substrate.

In an embodiment of the present invention, an area of the radiation layer is less than an area of a substrate surface of the substrate.

In an embodiment of the present invention, an area of the ground layer is equal to an area of the substrate-back face.

In an embodiment of the present invention, the substrate is made of ceramic materials.

DETAILED DESCRIPTION OF THE INVENTION

Figure 1:
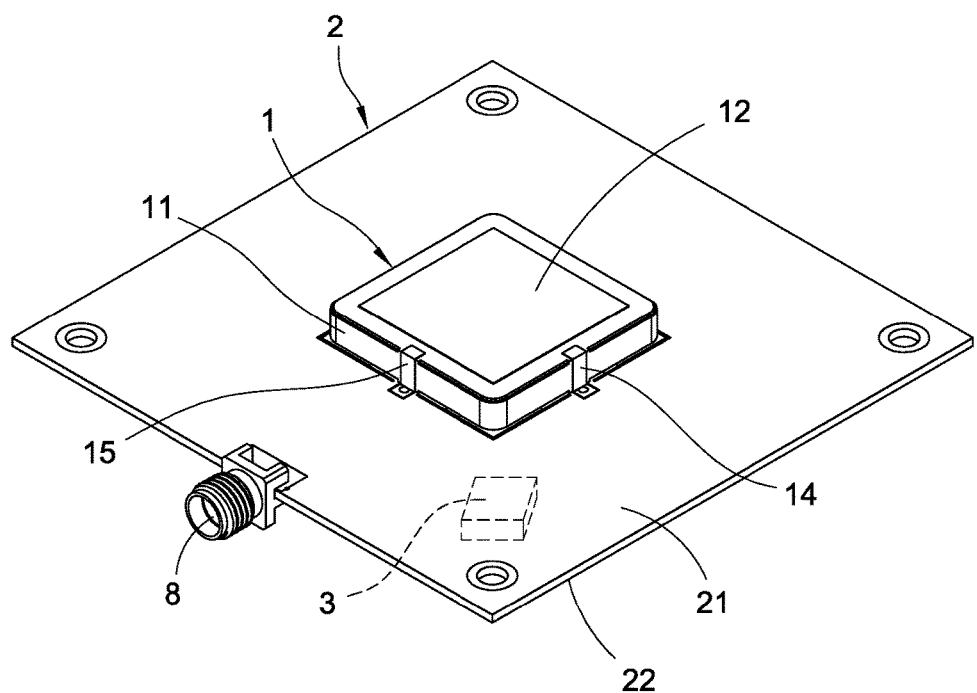
FIG. 1 shows an assembly diagram of the first embodiment of the signal transceiver module of the present invention.
Figure 2:
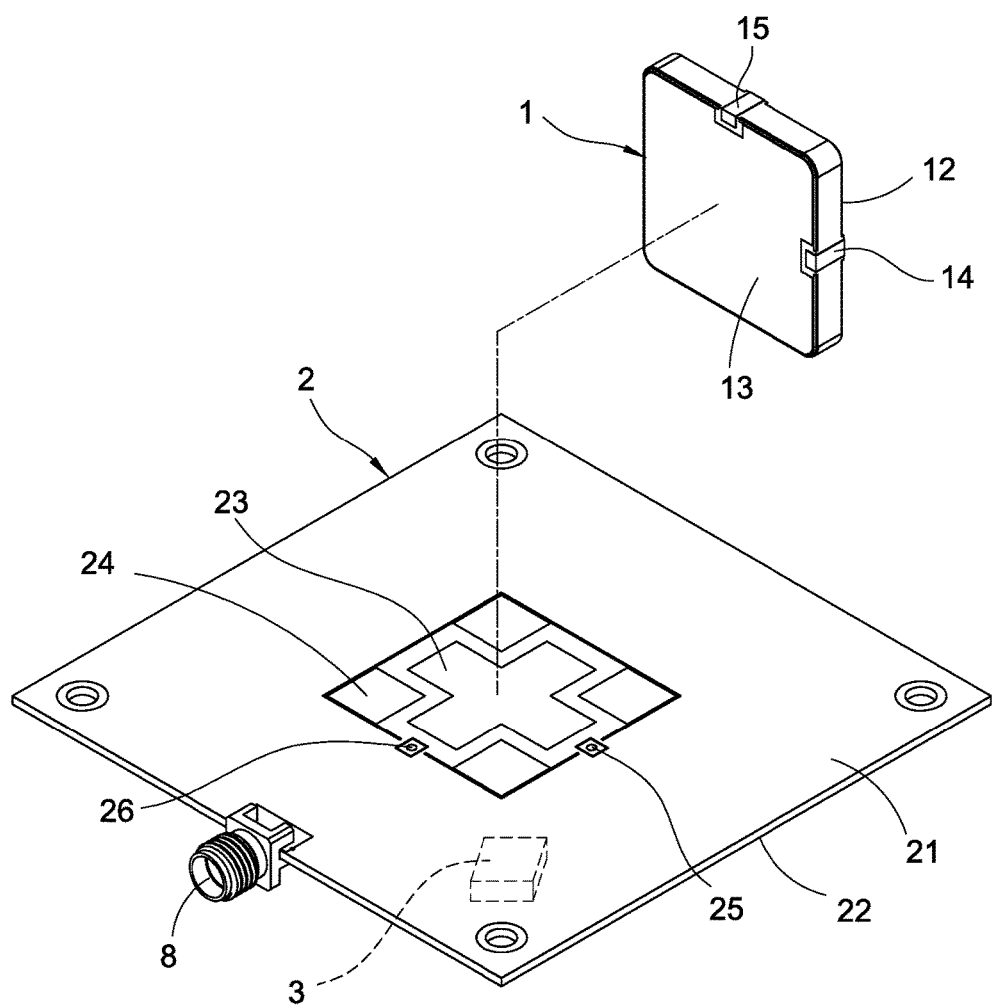
FIG. 2 shows an exploded view of the first embodiment of the signal transceiver module of the present invention.
Figure 3:
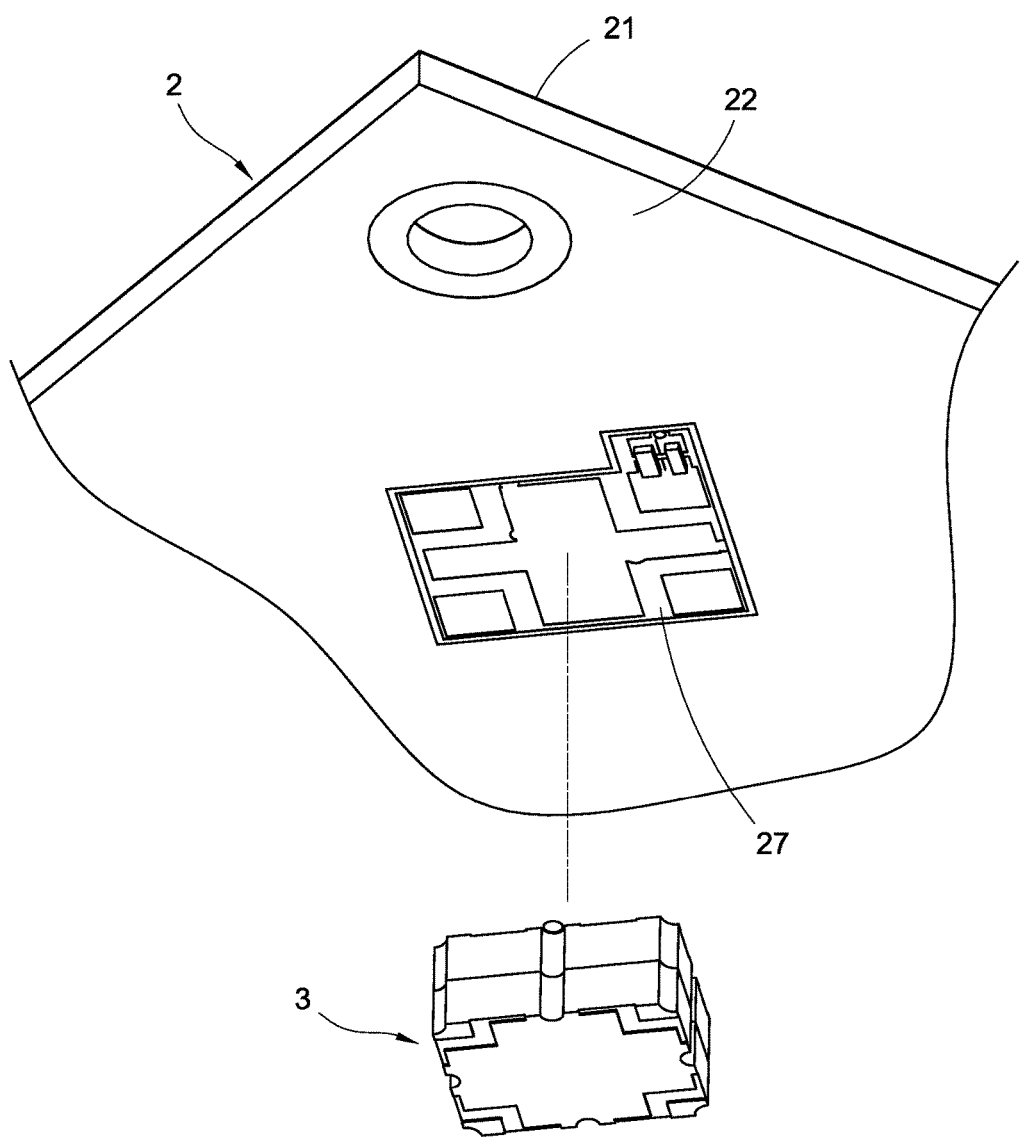
FIG. 3 shows the circuit-board-back face of the circuit board of FIG. 1.

Please now refer to following detailed description and figures for the technical content of the present invention:

FIG. 1 shows an assembly diagram of the first embodiment of the signal transceiver module of the present invention. FIG. 2 shows an exploded view of the first embodiment of the signal transceiver module of the present invention. FIG. 3 shows the circuit-board-back face of the circuit board of FIG. 1. As shown in FIG. 1, FIG. 2 and FIG. 3, the surface-mounted signal transceiver module 10 of the present invention with multi-signal feed-in comprises an antenna unit 1, a circuit board 2 and a signal-integrating component 3. Moreover, the "surface-mounted signal transceiver module 10" of the present invention can be referred to as the "signal transceiver module 10 in a surface-mounted type", or can be simply abbreviated as the "signal transceiver module 10".

The antenna unit 1 comprises a substrate 11, a radiation layer 12, a ground layer 13, a first-feed-in line 14 and a second-feed-in line 15. The substrate 11 comprises a substrate-front face, a substrate-back face and a substrate-side face. The substrate 11 is made of ceramic materials. The radiation layer 12 is arranged on the substrate-front face of the substrate 11. An area of the radiation layer 12 is less than an area of a substrate surface of the substrate 11 (for example, the area of the radiation layer 12 is less than an area of the substrate-front face of the substrate 11). The ground layer 13 is arranged on the substrate-back face of the substrate 11. An area of the ground layer 13 is equal to an area of the substrate-back face. Moreover, the first-feed-in line 14 and the second-feed-in line 15 are arranged on the substrate-side face of the substrate 11. One side of the first feed-in line 14 and one side of the second feed-in line 15 extend to the substrate-front face of the substrate 11 respectively. The other side of the first feed-in line 14 and the other side of the second feed-in line 15 extend to the substrate-back face of the substrate 11 respectively. The first feed-in line 14 and the second feed-in line 15 extend to the substrate-front face of the substrate 11 to form coupled electrical connections with the radiation layer 12 (namely, the first feed-in line 14 and the second feed-in line 15 are electrically connected to the radiation layer 12). Neither the first feed-in line 14 extending to the substrate-back face of the substrate 11 nor the second feed-in line 15 extending to the substrate-back face of the substrate 11 is electrically connected to the ground layer 13 arranged on the substrate-back face of the substrate 11. Moreover, the first-feed-in line 14 and the second-feed-in line 15 are arranged on the substrate-front face, the substrate-side face and the substrate-back face of the substrate 11 with a mutually perpendicular status. Namely, the first-feed-in line 14 and the second-feed-in line 15 are perpendicular to each other in virtual extension lines (not shown in the figures) and are arranged on the substrate-front face, the substrate-side face and the substrate-back face of the substrate 11.

The circuit board 2 comprises a circuit-board-front face 21, a circuit-board-back face 22, a first-ground face 23, four second-ground faces 24, a first contact 25, a second contact 26 and a fixing-connecting area 27. The first-ground face 23 is cross-shaped and is arranged on the circuit-board-front face 21. Four sides of the first-ground face 23 are adjacent to the four second-ground faces 24. The first-ground face 23 and the second-ground face 24 are electrically connected to the ground layer 13. The first contact 25 and the second contact 26 are electrically connected to the first-feed-in line 14 and the second-feed-in line 15 respectively. Moreover, the first contact 25 and the second contact 26 are arranged on the circuit-board-front face 21 of the circuit board 2 with the mutually perpendicular status. Namely, the first contact 25 and the second contact 26 are perpendicular to each other on the virtual extension lines and are arranged on the circuit-board-front face 21 of the circuit board 2. Moreover, the first contact 25 and the second contact 26 are electrically connected to the fixing-connecting area 27 through the circuit board 2 respectively, wherein the fixing-connecting area 27 is arranged on the circuit-board-back face 22 of the circuit board 2. The signal transceiver module 10 further comprises a cable connector 8, or the signal transceiver module 10 is applied to the cable connector 8. The fixing-connecting area 27 is electrically connected to the cable connector 8 through the circuit board 2.

The signal-integrating component 3 is electrically connected to the fixing-connecting area 27 and is arranged on the fixing-connecting area 27, so that the signal-integrating component 3 integrates a plurality of signals through the circuit board 2, wherein the signals are sent through the first-feed-in line 14 and the second-feed-in line 15.

According to the antenna unit 1 being mounted on the circuit board 2 with surface mount technology, and according to the signals being sent with multi-signal feed-in method to the signal-integrating component 3 on the circuit board 2 to integrate and process the signals to output the signals after the signals are integrated and processed, the surface-mounted signal transceiver module 10 with multi-signal feed-in is achieved.

Figure 4:
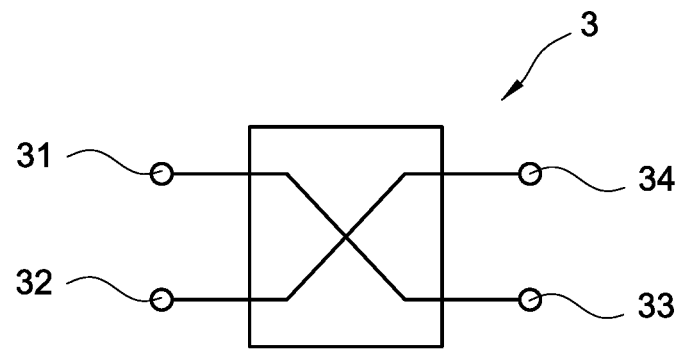
FIG. 4 shows an internal circuit diagram of the first embodiment of the signal-integrating component of the present invention.
Figure 5:
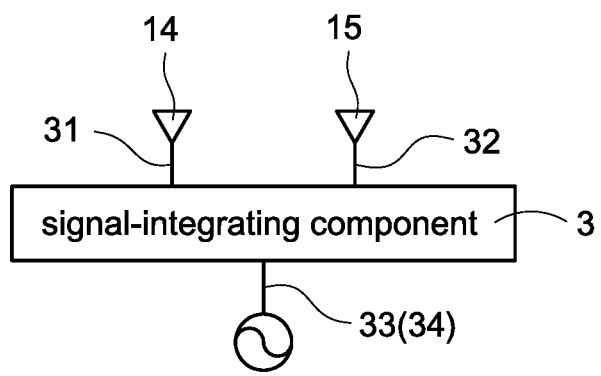
FIG. 5 shows an equivalent circuit block diagram of the first embodiment of the signal transceiver module of the present invention.

FIG. 4 shows an internal circuit diagram of the first embodiment of the signal-integrating component of the present invention. FIG. 5 shows an equivalent circuit block diagram of the first embodiment of the signal transceiver module of the present invention. Please refer to FIG. 1, FIG.

2 and FIG. 3 at the same time. As shown in FIG. 4 and FIG. 5, in the signal transceiver module 10 of the preset invention, after the antenna unit 1 is electrically connected to the circuit board 2 and the signal-integrating component 3 is electrically connected to the fixing-connecting area 27 of the circuit board 2 to form an equivalent circuit as shown in FIG. 4, the first-feed-in line 14 and the second-feed-in line 15 are electrically connected to a first pin 31 and a second pin 32 of the signal-integrating component 3 (Hybrid) through the circuit board 2 to form a frequency band (for example, 1575.42 MHZ) used by GPS. According to different requirement, a third pin 33 and a fourth pin 34 of the signal-integrating component 3 can be modified as an output that two signal sources are integrated as one signal source. One of the pins (namely, the third pin 33 or the fourth pin 34) can be selected to output to control the antenna structure characteristic.

Figure 6:
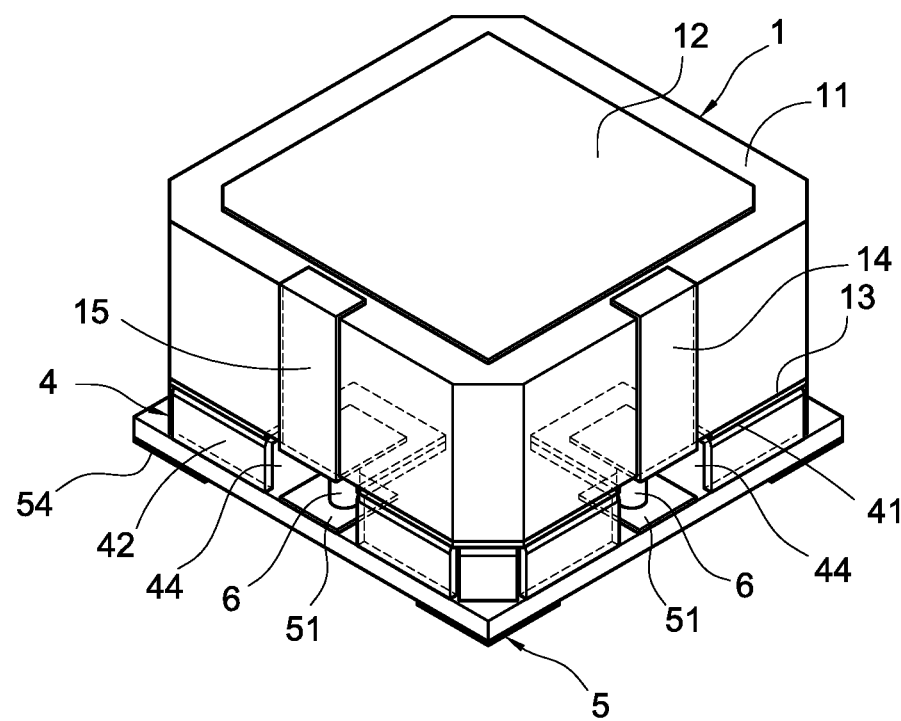
FIG. 6 shows an assembly diagram of the second embodiment of the signal transceiver module of the present invention.
Figure 7:
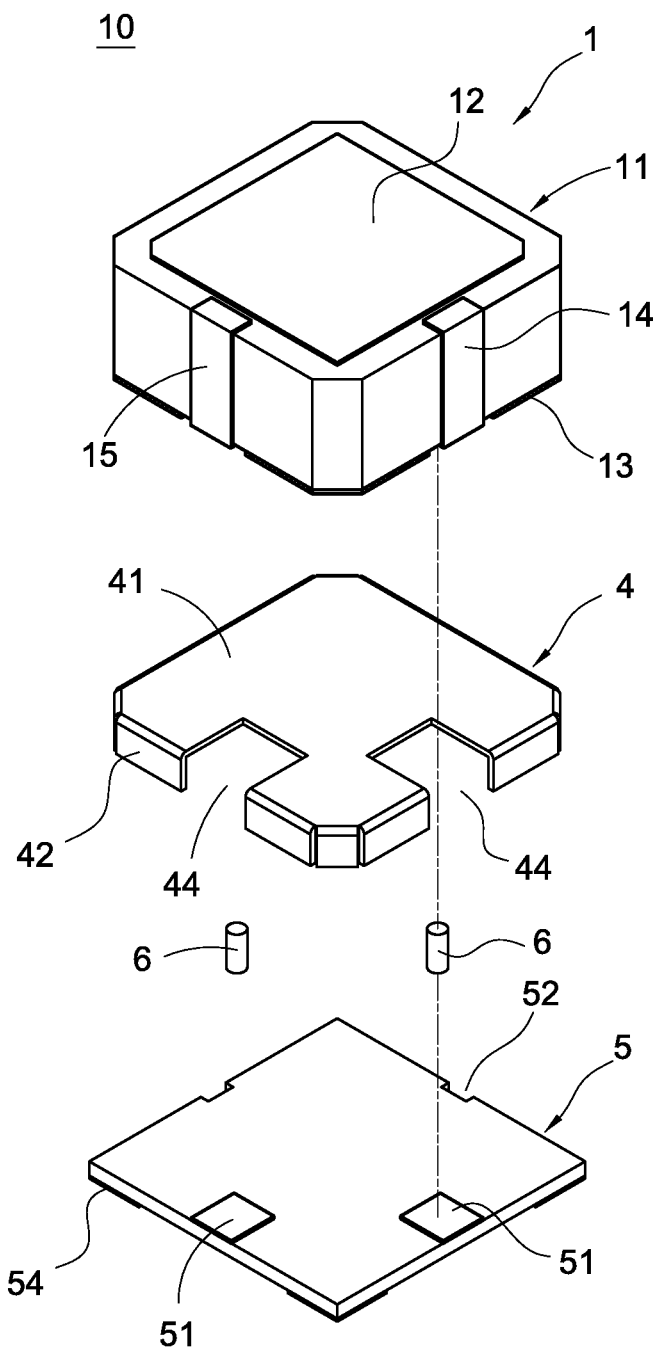
FIG. 7 shows an exploded view of the second embodiment of the signal transceiver module of the present invention.
Figure 8:
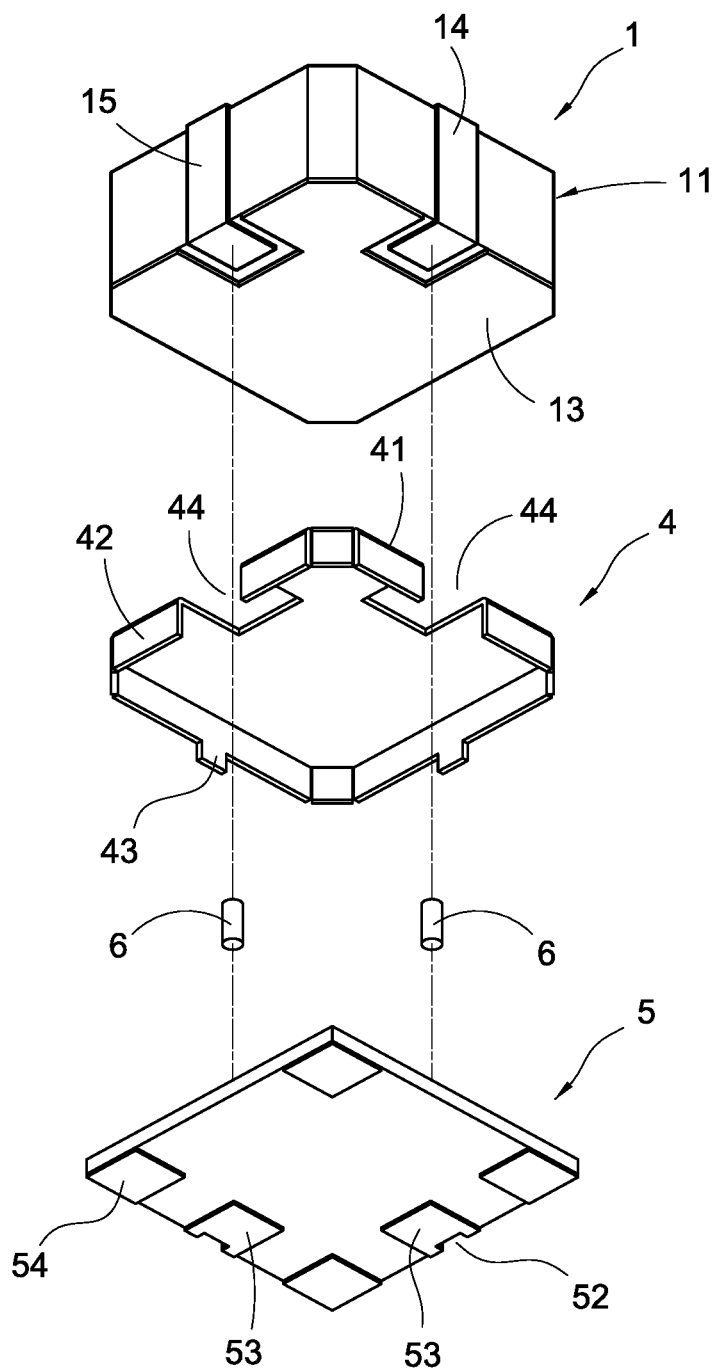
FIG. 8 shows an exploded view from another angle of the second embodiment of the signal transceiver module of the present invention.

FIG. 6 shows an assembly diagram of the second embodiment of the signal transceiver module of the present invention. FIG. 7 shows an exploded view of the second embodiment of the signal transceiver module of the present invention. FIG. 8 shows an exploded view from another angle of the second embodiment of the signal transceiver module of the present invention. As shown in FIG. 6, FIG. 7 and FIG. 8, the difference between the second embodiment of the present invention and the first embodiment of the present invention is that the signal transceiver module 10 comprises a metal shell 4, a circuit board 5, and two conducting components 6.

The metal shell 4 comprises a platform 41, a plurality of support chips 42 and a plurality of joint parts 43. The platform 41 comprises a platform surface and a platform-side edge. The platform surface of the platform 41 is electrically connected to the ground layer 13. The platform-side edge of the platform 41 extends to the support chips 42, wherein the platform 41 and the support chips 42 are mutually perpendicular. Namely, the platform surface of the platform 41 is perpendicularly connected to the support chips 42. Each of the support chips 42 extends to the joint part 43. A plurality of notches 52 are defined by a circuit-board-side edge of the circuit board 5. The joint parts 43 are bended or straight to be through the notches 52 defined by the circuit-board-side edge of the circuit board 5 to be electrically connected to the ground parts 53. Moreover, two openings 44 are defined by the platform 41. The two conducting components 6 are electrically contacted or connected to the circuit board 5 through the two openings 44. Moreover, the two openings 44 are perpendicular to each other (on the virtual extension lines) and are defined on the metal shell 4.

The circuit board 5 comprises a circuit-board-front face, the circuit-board-side edge, a circuit-board-back face, two signal feed-in points 51, a plurality of ground parts 53 and at least one conducting part 54 at the same time besides an electronic part (not shown in the figures) electrically connected to and arranged on the circuit-board-front face. The two signal feed-in points 51 are arranged on the circuit-board-front face. Each of the two signal feed-in points 51 renders that each of the two conducting components 6 has electrical contact or connection (namely, the two signal feed-in points 51 are electrically connected to the two conducting components 6 respectively), so that the signals are sent to a filter (not shown in the figures) and an amplifier (not shown in the figures), or the signals are sent to a circuit (not shown in the figures) of a receiver module (not shown in the figures), the filter (not shown in the figures) and the amplifier (not shown in the figures) to process to form an active antenna signal transceiver module. Moreover, the notches 52 are defined by the circuit-board-side edge of the circuit board 5. Each of the ground parts 53 is arranged on the circuit-board-back face of the circuit board 5 and is arranged in accordance with each of the notches 52. The joint parts 43 extended from the support chips 42 are bended or straight to be through the notches 52 defined by the circuit-board-side edge of the circuit board 5 to be electrically connected to the ground parts 53. Moreover, the at least one conducting part 54 is arranged on the circuit-board-back face of the circuit board 5. The conducting part 54 renders that the circuit board 5 is electrically connected to and arranged on a motherboard (not shown in the figures) of an electronic apparatus (not shown in the figures).

The two conducting components 6 are anyone of segments, columns, shrapnel and springs made of metal materials. One of the two conducting components 6 is electrically contacted between the first-feed-in line 14 arranged on the substrate-back face of the substrate 11 and one of the two signal feed-in points 51. The other conducting component 6 is electrically contacted between the second-feed-in line 15 arranged on the substrate-back face of the substrate 11 and the other signal feed-in point 51. Therefore, the two conducting components 6 are used as signal feed-in.

Figure 9:
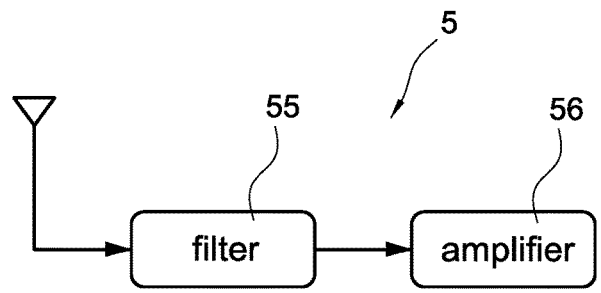
FIG. 9 shows a circuit block diagram of the second embodiment of the signal transceiver module of the present invention.
Figure 10:
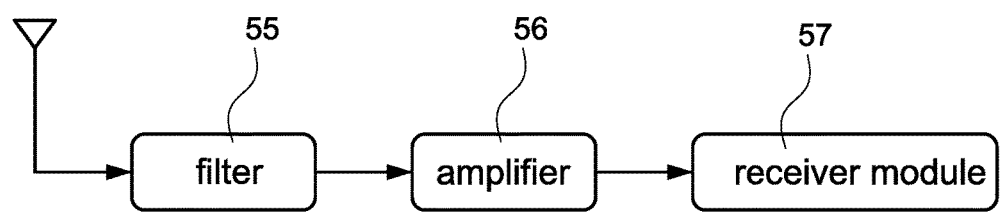
FIG. 10 shows another circuit block diagram of the second embodiment of the signal transceiver module of the present invention.

FIG. 9 shows a circuit block diagram of the second embodiment of the signal transceiver module of the present invention. FIG. 10 shows another circuit block diagram of the second embodiment of the signal transceiver module of the present invention. As shown in FIG. 9 and FIG. 10, an electronic component circuit which is a related art circuit arranged on the circuit board 5 of the present invention comprise a filter 55 and an amplifier 56. The filter 55 is used to filter noises in the signals. The signals after being filtered is amplified by the amplifier 56 to be sent to the motherboard (not shown in the figures) of the electronic apparatus (not shown in the figures) to form the active antenna signal transceiver module. Or, a receiver module 57 (for example, a circuit of GPS system) is further arranged on the circuit board 5 and is manufactured on the same circuit board 5 with the filter 55 and the amplifier 56. The filter 55 is used to filter noises in the signals. The signals after being filtered is amplified by the amplifier 56 to be sent to the receiver module 57. After the receiver module 57 processes the signals, the signals are sent to the motherboard (not shown in the figures) of the electronic apparatus (not shown in the figures) to form the active antenna signal transceiver module, so that the electronic apparatus (not shown in the figures) can display the related images or data of the global positioning system (GPS).

Figure 11:
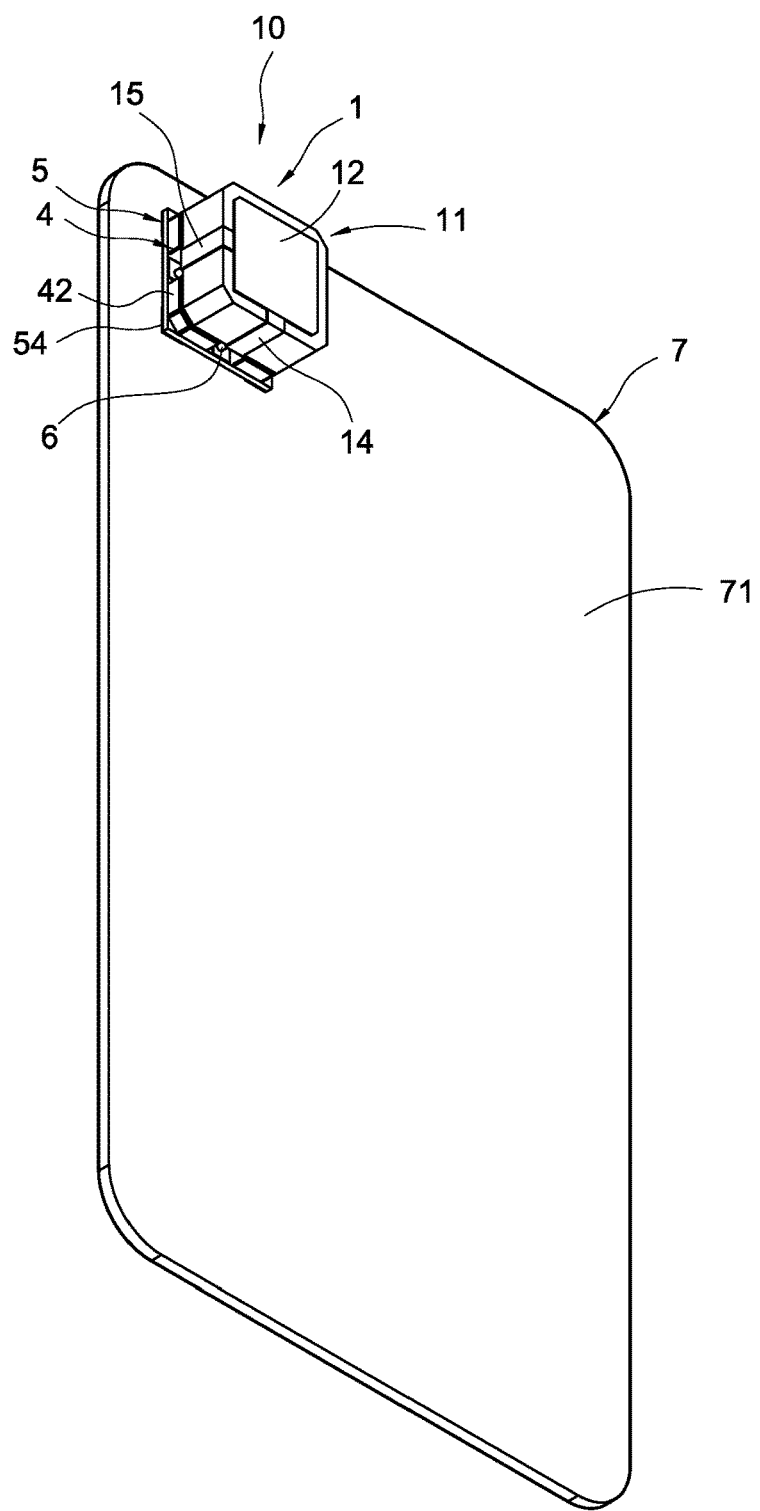
FIG. 11 shows a diagram of the second embodiment of the signal transceiver module of the present invention connecting to the motherboard of the electronic apparatus.
Figure 12:
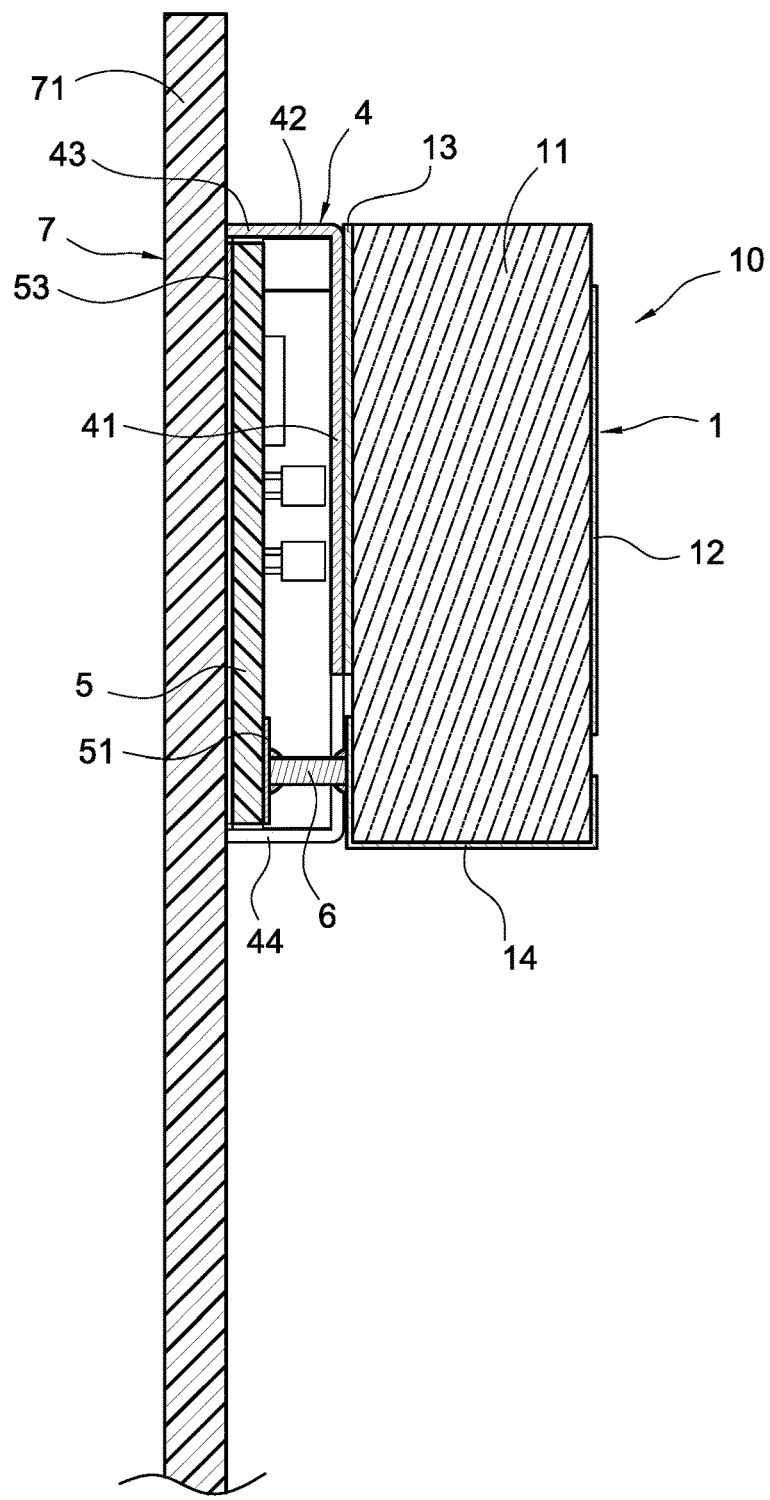
FIG. 12 shows a side view of the second embodiment of the signal transceiver module of the present invention connecting to the motherboard of the electronic apparatus.

FIG. 11 shows a diagram of the second embodiment of the signal transceiver module of the present invention connecting to the motherboard of the electronic apparatus. FIG. 12 shows a side view of the second embodiment of the signal transceiver module of the present invention connecting to the motherboard of the electronic apparatus. As shown in FIG. 11 and FIG. 12, the metal shell 4 is electrically connected to the ground layer 13 arranged on the substrate-back face of the substrate 11. The joint part 43 extended from the support chip 42 is assembled with the notches 52 defined by the circuit-board-side edge of the circuit board 5 and is electrically connected to the ground part 53. At the same time, the two conducting components 6 are electrically contacted or connected between the first feed-in line 14 and the second feed-in line 15 arranged on the substrate 11 and the two signal feed-in points 51 of the circuit board 5 respectively. Namely, one of the two conducting components 6 is electrically contacted or connected between the first feed-in line 14 arranged on the substrate 11 and one of the two signal feed-in points 51 of the circuit board 5. The other conducting component 6 is electrically contacted or connected between the second feed-in line 15 arranged on the substrate 11 and the other signal feed-in point 51 of the circuit board 5.

After the signal transceiver module 10 has been assembled, the conducting part 54 arranged on the circuit-board-back face of the circuit board 5 is used to be electrically connected to a motherboard 71 of an electronic apparatus 7, so that the signal transceiver module 10 is electrically connected to and arranged on a surface of the motherboard 71.

With the redesign of the signal transceiver module 10, the structure of the whole signal transceiver module 10 is more simplified, and the signal transceiver module 10 has thinner thickness, and the signal transceiver module 10 forms a circularly polarized antenna with multi-signal feed-in to increase the antenna bandwidth.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A signal transceiver module in a surface-mounted type with multi-signal feed-in comprising:
    an antenna unit comprising a substrate, a radiation layer, a ground layer, a first-feed-in line and a second-feed-in line, the substrate comprising a substrate-front face, a substrate-back face and a substrate-side face, the radiation layer arranged on the substrate-front face of the substrate, the ground layer arranged on the substrate-back face of the substrate, the first-feed-in line and the second-feed-in line arranged on the substrate-side face of the substrate, one side of the first feed-in line and one side of the second feed-in line extending to the substrate-front face of the substrate respectively to form coupled electrical connections with the radiation layer, the other side of the first feed-in line and the other side of the second feed-in line extending to the substrate-back face of the substrate respectively, neither the other side of the first feed-in line nor the other side of the second feed-in line electrically connected to the ground layer;
    a circuit board comprising a circuit-board-front face, a circuit-board-back face, a first-ground face, a first contact, a second contact and a fixing-connecting area, the first-ground face, the first contact and the second contact arranged on the circuit-board-front face, the first-ground face electrically connected to the ground layer, the first contact and the second contact electrically connected to the first-feed-in line and the second-feed-in line respectively, the first contact and the second contact electrically connected to the fixing-connecting area arranged on the circuit-board-back face through the circuit board respectively; and
    a signal-integrating component electrically connected to and arranged on the fixing-connecting area, so the signal-integrating component is electrically connected to the first-feed-in line and the second-feed-in line through the first contact and the second contact respectively,
    wherein the first-feed-in line and the second-feed-in line are arranged on the substrate-front face, the substrate-side face and the substrate-back face of the substrate with a mutually perpendicular status; the signal-integrating component is configured to integrate a plurality of signals sent through the first-feed-in line and the second-feed-in line;
    wherein the first-ground face is cross-shaped.

2. The signal transceiver module in claim 1, wherein an area of the radiation layer is less than an area of a substrate surface of the substrate.

3. The signal transceiver module in claim 1, wherein an area of the ground layer is equal to an area of the substrate-back face.

4. A signal transceiver module in a surface-mounted type with multi-signal feed-in comprising:
    an antenna unit comprising a substrate, a radiation layer, a ground layer, a first-feed-in line and a second-feed-in line, the substrate comprising a substrate-front face, a substrate-back face and a substrate-side face, the radiation layer arranged on the substrate-front face of the substrate, the ground layer arranged on the substrate-back face of the substrate, the first-feed-in line and the second-feed-in line arranged on the substrate-side face of the substrate, one side of the first feed-in line and one side of the second feed-in line extending to the substrate-front face of the substrate respectively to form coupled electrical connections with the radiation layer, the other side of the first feed-in line and the other side of the second feed-in line extending to the substrate-back face of the substrate respectively, neither the other side of the first feed-in line nor the other side of the second feed-in line electrically connected to the ground layer;
    a circuit board comprising a circuit-board-front face, a circuit-board-back face, a first-ground face, a first contact, a second contact and a fixing-connecting area, the first-ground face, the first contact and the second contact arranged on the circuit-board-front face, the first-ground face electrically connected to the ground layer, the first contact and the second contact electrically connected to the first-feed-in line and the second-feed-in line respectively, the first contact and the second contact electrically connected to the fixing-connecting area arranged on the circuit-board-back face through the circuit board respectively; and
    a signal-integrating component electrically connected to and arranged on the fixing-connecting area, so the signal-integrating component is electrically connected to the first-feed-in line and the second-feed-in line through the first contact and the second contact respectively,
    wherein the first-feed-in line and the second-feed-in line are arranged on the substrate-front face, the substrate-side face and the substrate-back face of the substrate with a mutually perpendicular status; the signal-integrating component is configured to integrate a plurality of signals sent through the first-feed-in line and the second-feed-in line;
    wherein the circuit board further comprises four second-ground faces; four sides of the first-ground face are adjacent to the four second-ground faces; the second-ground face is electrically connected to the ground layer.

5. The signal transceiver module in claim 4, wherein the first contact and the second contact are arranged between two of the second-ground faces respectively.

6. The signal transceiver module in claim 1, wherein the first contact and the second contact are arranged on the circuit-board-front face of the circuit board with the mutually perpendicular status.

7. The signal transceiver module in claim 1 further comprising a cable connector, wherein the signal-integrating component is electrically connected to the cable connector through the circuit board.

8. The signal transceiver module in claim 1, wherein the substrate is made of ceramic materials.

9. A signal transceiver module in a surface-mounted type with multi-signal feed-in comprising:
   an antenna unit comprising a substrate, a radiation layer, a ground layer, a first-feed-in line and a second-feed-in line, the substrate comprising a substrate-front face, a substrate-back face and a substrate-side face, the radiation layer arranged on the substrate-front face of the substrate, the ground layer arranged on the substrate-back face of the substrate, the first-feed-in line and the second-feed-in line arranged on the substrate-side face of the substrate, one side of the first feed-in line and one side of the second feed-in line extending to the substrate-front face of the substrate respectively to form coupled electrical connections with the radiation layer, the other side of the first feed-in line and the other side of the second feed-in line extending to the substrate-back face of the substrate respectively, neither the other side of the first feed-in line nor the other side of the second feed-in line electrically connected to the ground layer;
   a metal shell comprising a platform, a plurality of support chips and a plurality of joint parts, the platform comprising a platform surface and a platform-side edge, the platform surface of the platform electrically connected to the ground layer, the platform-side edge of the platform extending to the support chips, the platform and the support chips having a mutually perpendicular status, each of the support chips extending to the joint part, two openings defined by the platform;
   a circuit board comprising a circuit-board-front face, a circuit-board-side edge, a circuit-board-back face, two signal feed-in points, a plurality of ground parts and at least one conducting part, the two signal feed-in points arranged on the circuit-board-front face of the circuit board, a plurality of notches defined by the circuit-board-side edge of the circuit board, each of the ground parts arranged on the circuit-board-back face of the circuit board and arranged in accordance with each of the notches, the joint parts electrically connected to the ground parts through the notches, the at least one conducting part arranged on the circuit-board-back face of the circuit board; and
   two conducting components electrically contacted between the first-feed-in line, the second-feed-in line and the two signal feed-in points of the circuit board, wherein the first-feed-in line and the second-feed-in line are arranged on the substrate-front face, the substrate-side face and the substrate-back face of the substrate with the mutually perpendicular status; the first-feed-in line and the second-feed-in line are arranged on the metal shell in accordance with the two openings and are perpendicular to each other; the two conducting components are electrically contacted or connected to the two signal feed-in points of the circuit board through the two openings.

10. The signal transceiver module in claim 9, wherein an area of the radiation layer is less than an area of a substrate surface of the substrate.

11. The signal transceiver module in claim 9, wherein an area of the ground layer is equal to an area of the substrate-back face.

12. The signal transceiver module in claim 9 further comprising an electronic part, wherein the circuit-board-front face of the circuit board is electrically connected to the electronic part.

13. The signal transceiver module in claim 12, wherein the electronic part comprises a filter and an amplifier; the filter is electrically connected to the amplifier.

14. The signal transceiver module in claim 12, wherein the electronic part comprises a receiver module, a filter and an amplifier; the filter is electrically connected to the receiver module; the amplifier is electrically connected to the receiver module and the filter.

15. The signal transceiver module in claim 9, wherein the joint part is bended or straight to be through the notch defined by the circuit-board-side edge of the circuit board to be electrically connected to the ground part.

16. The signal transceiver module in claim 9, wherein the two conducting components are segments, columns, shrapnel or springs made of metal materials.

17. The signal transceiver module in claim 9, wherein the conducting part renders that the circuit board is electrically connected to and arranged on a motherboard of an electronic apparatus.

18. The signal transceiver module in claim 9, wherein the substrate is made of ceramic materials.

* * * * *